United States Patent
Masuoka et al.

(10) Patent No.: US 9,455,148 B2
(45) Date of Patent: Sep. 27, 2016

(54) METHOD FOR MANUFACTURING SEMICONDUCTOR DEVICE

(71) Applicants: Fumihito Masuoka, Tokyo (JP); Katsumi Nakamura, Tokyo (JP); Takao Kachi, Tokyo (JP)

(72) Inventors: Fumihito Masuoka, Tokyo (JP); Katsumi Nakamura, Tokyo (JP); Takao Kachi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/433,191

(22) PCT Filed: Dec. 7, 2012

(86) PCT No.: PCT/JP2012/081833
§ 371 (c)(1),
(2) Date: Apr. 2, 2015

(87) PCT Pub. No.: WO2014/087543
PCT Pub. Date: Jun. 12, 2014

(65) Prior Publication Data
US 2015/0255290 A1     Sep. 10, 2015

(51) Int. Cl.
| | | |
|---|---|---|
| *H01L 21/265* | (2006.01) | |
| *H01L 29/10* | (2006.01) | |
| *H01L 29/861* | (2006.01) | |
| *H01L 29/06* | (2006.01) | |
| *H01L 21/225* | (2006.01) | |
| *H01L 29/66* | (2006.01) | |

(Continued)

(52) U.S. Cl.
CPC ..... *H01L 21/26513* (2013.01); *H01L 21/2252* (2013.01); *H01L 21/26586* (2013.01); *H01L 29/0615* (2013.01); *H01L 29/0619* (2013.01); *H01L 29/1095* (2013.01); *H01L 29/6609* (2013.01); *H01L 29/861* (2013.01); *H01L 29/1608* (2013.01); *H01L 29/2003* (2013.01); *H01L 29/6606* (2013.01); *H01L 29/66204* (2013.01)

(58) Field of Classification Search
None
See application file for complete search history.

(56) References Cited

U.S. PATENT DOCUMENTS

| | | |
|---|---|---|
| 5,827,774 A | 10/1998 | Kitajima |
| 5,907,181 A | 5/1999 | Han et al. |
| 6,043,112 A | 3/2000 | Francis et al. |

(Continued)

FOREIGN PATENT DOCUMENTS

| | | |
|---|---|---|
| JP | H04-119632 A | 4/1992 |
| JP | H04-254323 A | 9/1992 |

(Continued)

OTHER PUBLICATIONS

International Search Report; PCT/JP2012/081833; Jan. 15, 2013.
(Continued)

*Primary Examiner* — Seahvosh Nikmanesh
(74) *Attorney, Agent, or Firm* — Studebaker & Brackett PC (57) ABSTRACT

An insulating film (2) is formed on a main surface of a semiconductor substrate (1) that includes an active region and a termination region. The insulating film (2) in the active region is etched to form an opening (3). The insulating film (2) is used as a mask and an impurity is implanted into the semiconductor substrate (1) in a direction tilted by 20° or more from a direction normal to the main surface of the semiconductor substrate (1) while rotating the semiconductor substrate (1) to form a diffusion layer (7) in the active region. The diffusion layer (7) extends wider than the opening (3) up to below the insulating film (2) on the termination region side.

5 Claims, 5 Drawing Sheets

(51) Int. Cl.
   *H01L 29/16*   (2006.01)
   *H01L 29/20*   (2006.01)

(56) References Cited

U.S. PATENT DOCUMENTS

| | | | | |
|---|---|---|---|---|
| 7,944,018 B2* | 5/2011 | Anderson | ............ | H01L 29/0634 257/522 |
| 8,129,252 B2* | 3/2012 | Anderson | ............ | H01L 29/0634 257/522 |
| 8,716,829 B2* | 5/2014 | Anderson | ............ | H01L 29/0634 257/522 |
| 8,736,019 B2* | 5/2014 | Anderson | ............ | H01L 29/0634 257/522 |
| 2008/0036015 A1* | 2/2008 | Anderson | ............ | H01L 29/0634 257/401 |
| 2009/0233415 A1* | 9/2009 | Anderson | ............ | H01L 29/0634 438/422 |
| 2011/0193158 A1* | 8/2011 | Anderson | ............ | H01L 29/0634 257/330 |
| 2011/0193176 A1* | 8/2011 | Anderson | ............ | H01L 29/0634 257/401 |
| 2012/0043582 A1 | 2/2012 | Koyama et al. | | |
| 2015/0021747 A1 | 1/2015 | Nishii et al. | | |

FOREIGN PATENT DOCUMENTS

| | | |
|---|---|---|
| JP | H07-193018 A | 7/1995 |
| JP | H07-221326 A | 8/1995 |
| JP | H09-008050 A | 1/1997 |
| JP | 2000-150531 A | 5/2000 |
| JP | 2007-096006 A | 4/2007 |
| JP | 2007-184439 A | 7/2007 |
| WO | 2013/153668 A1 | 10/2013 |

OTHER PUBLICATIONS

An Office Action issued by the Taiwanese Patent Office dated Aug. 18, 2014, which corresponds to Taiwanese Patent Application No. 102103423 and is related to the present U.S. Patent Application; with partial English language translation.

K. Nakamura et al.; "Advanced RFC Technology with New Cathode Structure of Field Limiting Rings for High Voltage Planar Diode"; Proceedings of the 22nd International Symposium on Power Semiconductor Devices & ICs; 2010; pp. 133-136.

A. Nishii et al.; "Relaxation of Current Filament due to RFC Technology and Ballast Resistor for Robust FWD Operation"; Proceedings of the 22nd International Symposium on Power Semiconductor Devices & ICs; 2011; pp. 96-99.

Notification of Transmittal of Translation of the International Preliminary Report on Patentability and Translation of Written Opinion of the International Searching Authority; PCT/JP2012/081833 issued on Jun. 18, 2015.

An Office Action; "Notification of Reason for Rejection," issued by the Japanese Patent Office on Jul. 28, 2015, which corresponds to Japanese Patent Application No. 2014-550879 and is related to U.S. Appl. No. 14/433,191; with English language partial translation.

* cited by examiner

METHOD FOR MANUFACTURING SEMICONDUCTOR DEVICE

TECHNICAL FIELD

The present invention relates to a method for manufacturing a semiconductor device applied to a high withstand voltage power module (≥600 V).

BACKGROUND ART

Semiconductor devices such as diodes applied to a high withstand voltage power module or IGBT are provided with a termination region around an active region to improve a withstand voltage. Here, the active region refers to a region through which a main current flows when a semiconductor device is ON. The termination region is a region in which no main current flows in an ON state and which extends a depletion layer in a lateral direction of the device to maintain the withstand voltage in an OFF state (when a reverse bias is applied).

In conventional semiconductor devices, carrier concentration increases on a boundary between a termination region and an active region during a recovery operation, electric field strength on an anode side thereby increases and exceeds critical electric field strength, which promotes impact ionization. When a current density in this part increases, local temperatures thereby increase and exceed a critical temperature (800 K or higher) to lead to thermal destruction (e.g., see Non-Patent Literature 1). As a countermeasure for this, there is a proposal of providing a ballast resistor at an end of an anode layer of the active region (e.g., see Non-Patent Literature 2).

CITATION LIST

Non-Patent Literature

Non-Patent Literature 1: K. Nakamura, et al, "Advanced RFC Technology with New Cathode Structure of Field Limiting Rings for High Voltage Planar Diode," Proc. ISPSD' 10, pp. 133-136, 2010
Non-Patent Literature 2: A. Nishii, et al., Proc. ISPSD' 11, pp 96-99, 2011

SUMMARY OF INVENTION

Technical Problem

It is possible to improve a recovery breakdown voltage by providing a ballast resistor. However, since the ballast resistor is conventionally formed in a step different from that of the anode layer, there is a problem that the manufacturing process becomes complicated.

The present invention has been implemented to solve the above-described problem and it is an object of the present invention to provide a method for manufacturing a semiconductor device capable of improving a recovery breakdown voltage without increasing the number of manufacturing steps.

Means for Solving the Problems

A method for manufacturing a semiconductor device according to the present invention includes: forming an insulating film on a main surface of a semiconductor substrate that includes an active region and a termination region; etching the insulating film in the active region to form a first opening; and using the insulating film as a mask and implanting an impurity into the semiconductor substrate in a direction tilted by 20° or more from a direction normal to the main surface of the semiconductor substrate while rotating the semiconductor substrate to form a diffusion layer in the active region, wherein the diffusion layer extends wider than the first opening up to below the insulating film on the termination region side.

Advantageous Effects of Invention

The present invention makes it possible to improve a recovery breakdown voltage without increasing the number of manufacturing steps.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

Embodiment 1

Figure 1:
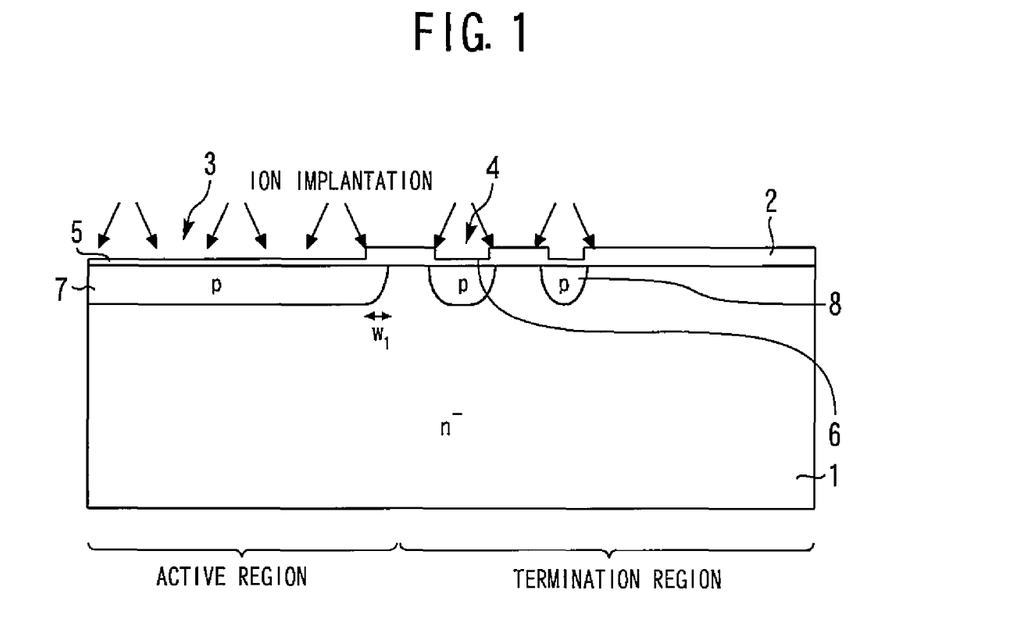
FIG. 1 is a cross-sectional view illustrating a method for manufacturing a semiconductor device according to Embodiment 1 of the present invention.
Figure 2:
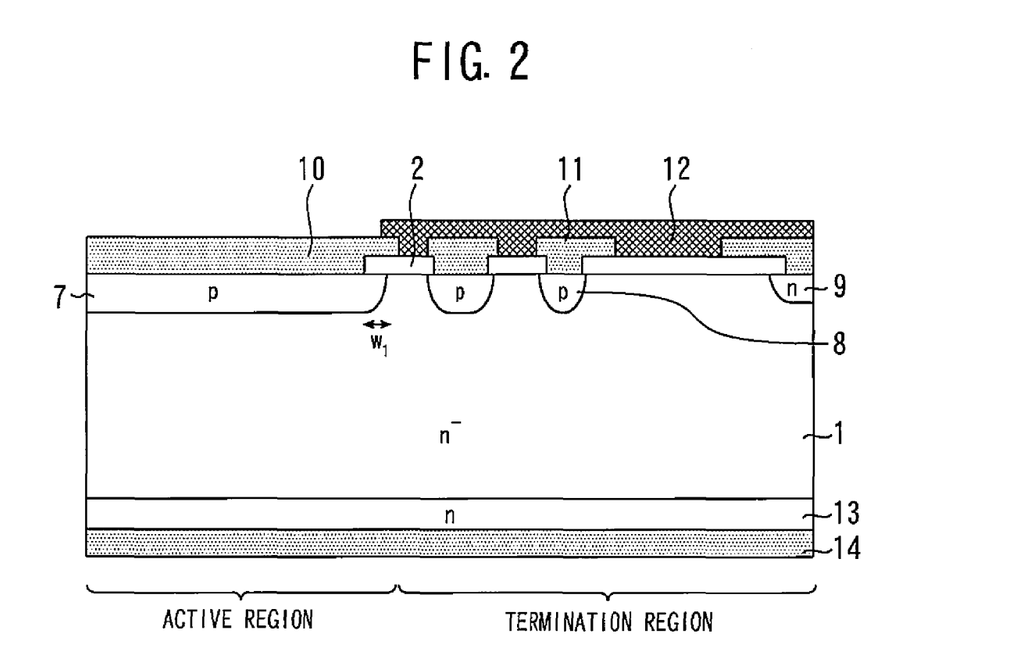
FIG. 2 is a cross-sectional view illustrating a method for manufacturing a semiconductor device according to Embodiment 1 of the present invention.

FIG. 1 and FIG. 2 are cross-sectional views illustrating a method for manufacturing a semiconductor device according to Embodiment 1 of the present invention.

First, as shown in FIG. 1, an oxide film 2 is formed on a main surface of an n⁻-type semiconductor substrate 1 that includes an active region and a termination region. The oxide film 2 in the active region is etched using a photoengraving process technique to form an opening 3, while the oxide film 2 in the termination region is etched to form a plurality of openings 4. At this time, a thin film 5 is left in the opening 3 and a thin film 6 is left in the plurality of openings 4.

Next, using the oxide film 2 as a mask, an impurity is implanted into the n⁻-type semiconductor substrate 1 via the thin films 5 and 6 in a direction tilted by 20° or more from the direction normal to the main surface of the n⁻-type semiconductor substrate 1 while rotating the n⁻-type semiconductor substrate 1 and high-temperature drive is performed. Thus, a p-type anode layer 7 and a plurality of p-type ring layers 8 are simultaneously formed in the active region and the termination region respectively. The p-type anode layer 7 extends wider than the opening 3 up to below the oxide film 2 on the termination region side. A penetration width thereof is w1.

Next, as shown in FIG. 2, an n-type channel stopper layer 9 is formed at an end of the termination region. The thin films 5 and 6 are over-etched by wet etching to form an anode electrode 10 and a ring electrode 11. A passivation film 12 of SiOx, SiN or the like is formed in the termination region to minimize influences from outside. A polyimide-based material may also be formed on the passivation film 12 depending on the withstand voltage to be maintained. An n-type cathode layer 13 is formed on the back of the n⁻-type semiconductor substrate 1 and a cathode electrode 14 connected thereto is formed.

In the present embodiment, since an impurity is implanted in the direction tilted by 20° or more from the direction normal to the main surface of the semiconductor substrate, the p-type anode layer 7 expands laterally with respect to the opening 3. This causes the p-type anode layer 7 to extend wider than the opening 3 up to below the oxide film 2 on the termination region side. This extended region constitutes a ballast resistor. Providing the ballast resistor at an end of the p-type anode layer 7 in the active region in this way can prevent thermal destruction caused by concentration of carriers accumulated in the termination region on the end of the p-type anode layer 7 during a recovery (turn-off) operation. Therefore, it is possible to improve a recovery breakdown voltage without increasing the number of manufacturing steps.

Furthermore, in the present embodiment, the openings disposed in the active region and the termination region respectively are formed simultaneously and the diffusion layers in both regions are formed simultaneously. This makes it possible to simplify the manufacturing process without adversely affecting device characteristics (e.g., withstand voltage VRRM, leakage current IRRM, snap-off resistance or the like).

The thickness of each of the thin films 5 and 6 is set to be a thickness required as an underlying oxide film corresponding to the ion species to be implanted. It is thereby possible to reduce the damage to the n⁻-type semiconductor substrate 1 and stabilize electrical characteristics. Also, since there is no need to form a separate underlying oxide film, it is possible to simplify the manufacturing process. Further, by adjusting the thicknesses of the thin films 5 and 6, it is possible to set the effective dose to an optimum value for the diffusion layer in the two regions.

Here, when the dose of the p-type anode layer 7 is reduced, a forward voltage VF increases and recovery loss (Erec) decreases. In other words, VF-EREC trade-off curve is shifted to a high-speed side. Therefore, since the advantage of reducing the EREC is large even when VF increases for a free-wheel diode incorporated into an inverter for high-frequency applications, it is desirable to reduce the dose of the p-type anode layer 7 to an extent that it is possible to secure the electrostatic withstand voltage.

The temperature dependence of the VF of the pn junction is basically positive and current flows more easily when the temperature increases. Since it is often the case that power chips are connected in parallel inside a large capacity power module, if a deviation occurs in the temperature distribution of the chips in the module, positive feedback may occur whereby current further flows into a chip which generates a large amount of heat and heat is generated, which may cause destruction of the module. For this reason, a cross point which is a current value at which the VF curve of the room temperature and the high-temperature VF curve cross each other is preferably low. Therefore, the cross point is lowered by reducing the effective dose of the anode and cathode, and reducing the efficiency of carrier implantation from both.

Note that the dose, diffusion depth, width and the number of layers of the p-type anode layer 7 and the p-type ring layer 8, and the design of the anode electrode 10, the ring electrode 11 and the oxide film 2 are design parameters that vary depending on the withstand voltage to be maintained.

Embodiment 2

Figure 3:
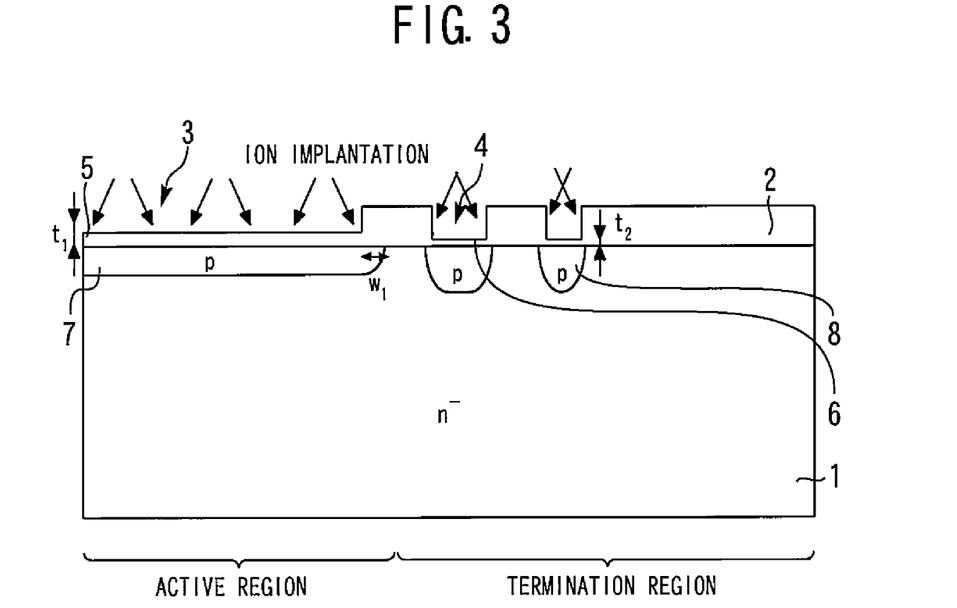
FIG. 3 is a cross-sectional view illustrating a method for manufacturing a semiconductor device according to Embodiment 2 of the present invention.

FIG. 3 is a cross-sectional view illustrating a method for manufacturing a semiconductor device according to Embodiment 2 of the present invention. A film thickness t1 of the thin film 5 and a film thickness t2 of the thin film 6 are made to differ from each other by performing photoengraving process and etching a plurality of times. Since t1>t2 here, the dose in the p-type anode layer 7 in the active region is lower than the dose of the p-type ring layer 8 in the termination region. As in the case of Embodiment 1, an impurity is implanted into the n⁻-type semiconductor substrate 1 via the thin films 5 and 6 in a direction tilted by 20° or more from the direction normal to the main surface of the n⁻-type semiconductor substrate 1 while rotating the n⁻-type semiconductor substrate 1 and high-temperature drive is performed.

As described above, in the present embodiment, the thin film 5 and the thin film 6 have different film thicknesses. It is thereby possible to form the p-type anode layer 7 and the p-type ring layer 8 with an appropriate dose by one ion implantation.

Here, a technique is available to obtain a diode which is appropriate for a high-speed recovery operation (low EREC) as well as a low-speed recovery operation (low forward voltage VF) by adjusting the dose of the p-type anode layer 7. However, this p-type anode layer 7 has a great influence on electrical characteristics of the diode. Increasing the dose makes a voltage oscillating phenomenon more likely to occur during recovery. In contrast, decreasing the dose causes the penetration width of the depletion layer on the anode side to increase, reducing the withstand voltage. That is, there is a limit to the control range of the VF-EREC trade-off characteristic by the p-type anode layer 7. On the other hand, there are optimum doses for the p-type ring layer 8 in the termination region and a RESURF structure respectively.

Thus, in the present embodiment, the thin films 5 and 6 are made to have different film thicknesses. This makes it possible to provide a difference in the dose of the diffusion layer between the active region and the termination region. Moreover, since there is no need to form both regions separately, it is possible to simplify the manufacturing process and also avoid overlap misalignment in the active region and the termination region in the photoengraving process.

By adopting t1>t2, it is possible to form the p-type anode layer 7 in the active region having low surface concentration and a small diffusion depth and the p-type ring layer 8 in the termination region having high surface concentration and a large diffusion depth simultaneously. It is thereby possible to obtain a semiconductor device capable of high-speed switching operation while maintaining the static withstand voltage without increasing the number of manufacturing steps.

Embodiment 3

Figure 4:
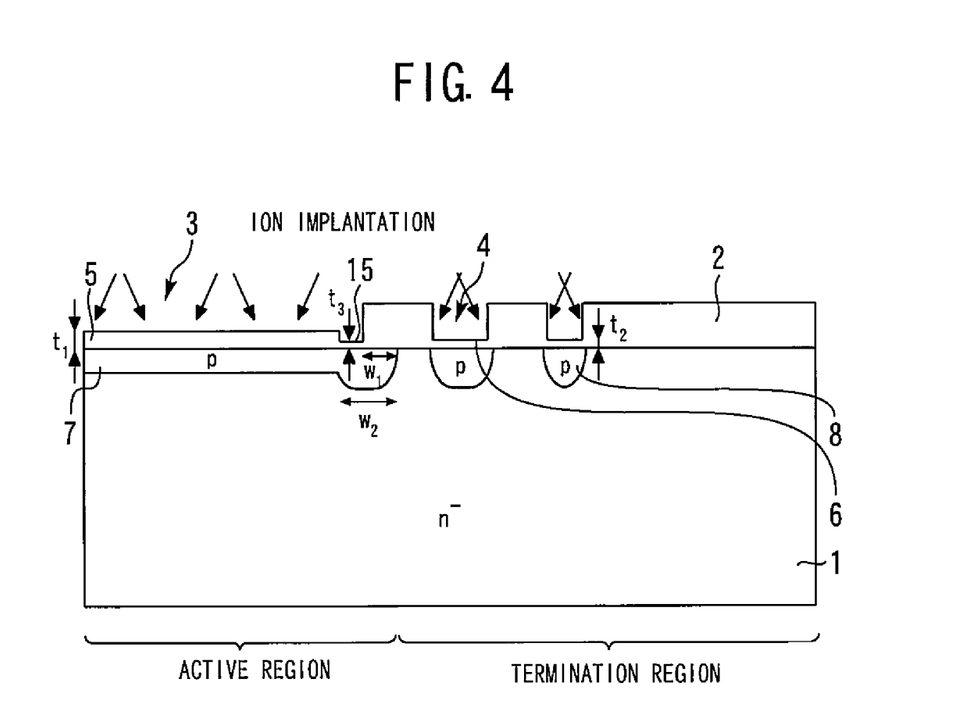
FIG. 4 is a cross-sectional view illustrating a method for manufacturing a semiconductor device according to Embodiment 3 of the present invention.

FIG. 4 is a cross-sectional view illustrating a method for manufacturing a semiconductor device according to Embodiment 3 of the present invention. When the opening 3 is formed, a thin film 15 is left at an end of the opening 3 on the termination region side. The p-type anode layer 7 is formed by implanting an impurity into the n⁻-type semiconductor substrate 1 via the thin films 5 and 15. A film thickness t3 of the thin film 15 is smaller than the film thickness t1 of the thin film 5 (t1>t3) and the film thickness of t3 is set, for example, to the same film thickness as t2 or a film thickness between t2 and t1. As in the case of Embodiment 1, an impurity is implanted into the n⁻-type semiconductor substrate 1 in a direction tilted by 20° or more from the direction normal to the main surface of the n⁻-type semiconductor substrate 1 while rotating the n⁻-type semiconductor substrate 1 and high-temperature drive is performed.

Furthermore, if t1>t3, the penetration width w1 of the p-type anode layer 7 can be increased, and it is thereby possible to further improve a recovery breakdown voltage. Moreover, if t1>t3, a deep part is formed at an end of the p-type anode layer 7 on the termination region side. A width w2 of this deep part is made to be greater by on the order of 15 μm than the penetration width w1. This makes it possible to suppress an electric field at the end of the p-type anode layer 7 during recovery and further improve a recovery breakdown voltage.

Embodiment 4

Figure 5:
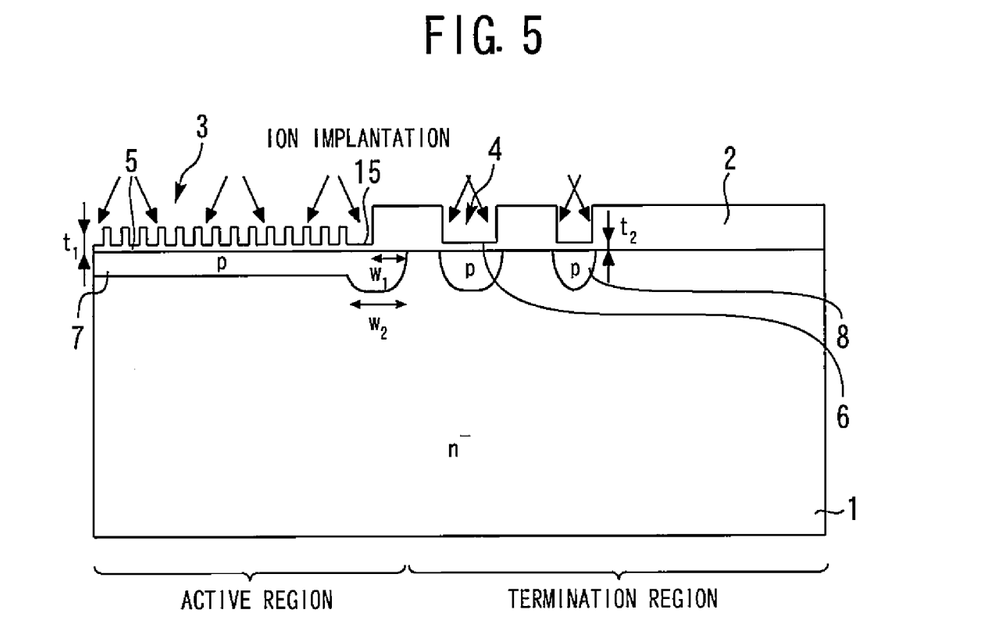
FIG. 5 is a cross-sectional view illustrating a method for manufacturing a semiconductor device according to Embodiment 4 of the present invention.

FIG. 5 is a cross-sectional view illustrating a method for manufacturing a semiconductor device according to Embodiment 4 of the present invention. The thin film 5 is provided with a plurality of steps. This allows the dose of the p-type anode layer 7 to be adjusted. The rest of the configuration and effects are the same as those in Embodiment 3.

Embodiment 5

Figure 6:
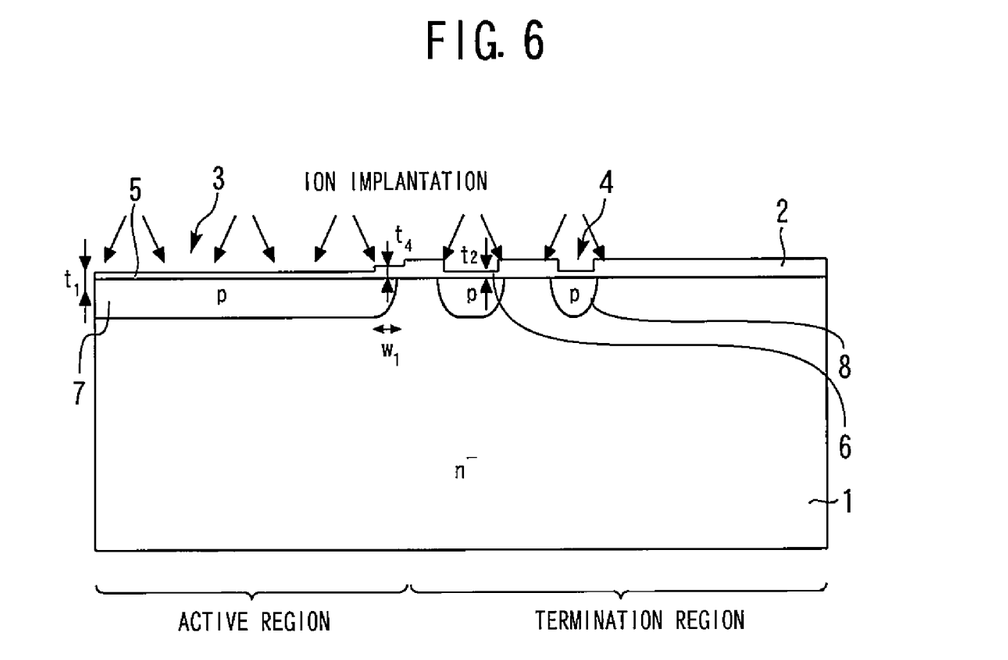
FIG. 6 is a cross-sectional view illustrating a method for manufacturing a semiconductor device according to Embodiment 5 of the present invention.

FIG. 6 is a cross-sectional view illustrating a method for manufacturing a semiconductor device according to Embodiment 5 of the present invention. A film thickness of the thin film 5 is t4 at an end of the opening 3 on the termination region side, which is greater than the film thickness t1 of the other part of the thin film 5 (t4>t1). As in the case of Embodiment 1, an impurity is implanted into the n⁻-type semiconductor substrate 1 via the thin films 5 and 6 in a direction tilted by 20° or more from the direction normal to the main surface of the n⁻-type semiconductor substrate 1 while rotating the n⁻-type semiconductor substrate 1 and high-temperature drive is performed.

At the end of the opening 3 on the termination region side, the film thickness of the thin film 5 increases toward the termination region side. This causes the dose of the thin film 5 to decrease in the part extended up to below the oxide film 2 on the termination region side compared to other parts. This makes it possible to further improve the recovery breakdown voltage.

Embodiment 6

Figure 7:
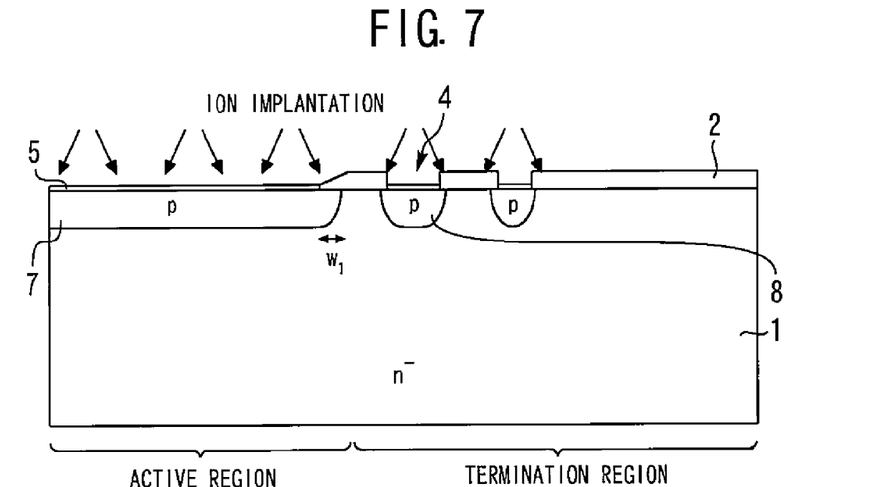
FIG. 7 is a cross-sectional view illustrating a method for manufacturing a semiconductor device according to Embodiment 6 of the present invention.

FIG. 7 is a cross-sectional view illustrating a method for manufacturing a semiconductor device according to Embodiment 6 of the present invention. The thin film 5 is inclined at an end of the opening 3 on the termination region side and the film thickness of the thin film 5 increases toward the termination region side. Effects similar to those of Embodiment 5 can be thereby obtained.

Embodiment 7

Figure 8:
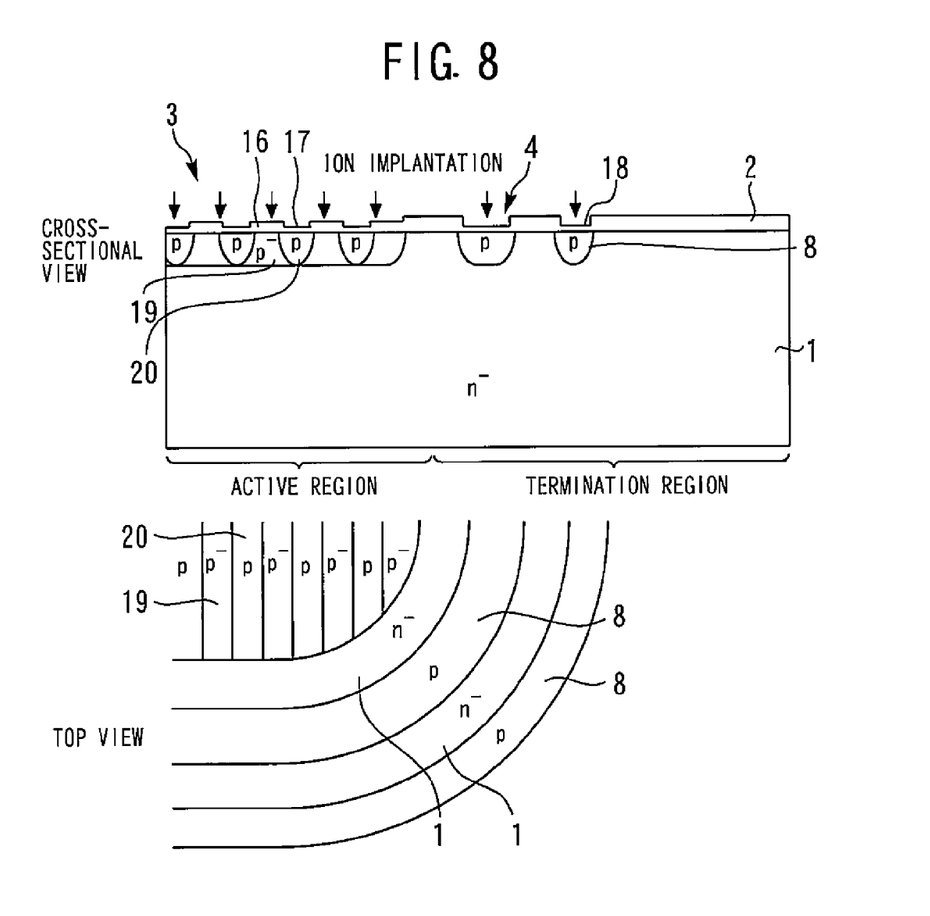
FIG. 8 shows a cross-sectional view and a top view illustrating a method for manufacturing a semiconductor device according to Embodiment 7 of the present invention.

FIG. 8 shows a cross-sectional view and a top view illustrating a method for manufacturing a semiconductor device according to Embodiment 7 of the present invention. However, the oxide film 2 is not shown in the top view.

First, the oxide film 2 is formed on the main surface of the n⁻-type semiconductor substrate 1 including the active region and the termination region. Next, the oxide film 2 in the active region is etched to form the opening 3 with thin films 16 and 17 having different film thicknesses being left. The thin film 17 has a stripe shape. During the etching to form the opening 3, the oxide film 2 in the termination region is also etched to form the opening 4 with a thin film 18 being left.

Next, an impurity is implanted into the n⁻-type semiconductor substrate 1 via the thin films 16 and 17 and high-temperature drive is performed. In this way, a p⁻-type anode layer 19 and a p-type anode layer 20 having different impurity concentrations are formed in the active region. Here, the p-type anode layer 20 has a stripe shape. At the same time, an impurity is implanted into the n⁻-type semiconductor substrate 1 via the thin film 18 to form the p-type ring layer 8 in the termination region. Subsequent steps are the same as those in Embodiment 1.

By providing steps in the thin film to be left in the opening 3, it is possible to collectively form the p⁻-type anode layer 19 and the p-type anode layer 20 having different surface concentrations and diffusion depths. Moreover, the p-type anode layer 20 having high impurity concentration makes it possible to secure ohmic contact with the electrode. Adjusting the impurity concentration of the p⁻-type anode layer 19 also allows a high-speed switching operation.

Embodiment 8

Figure 9:
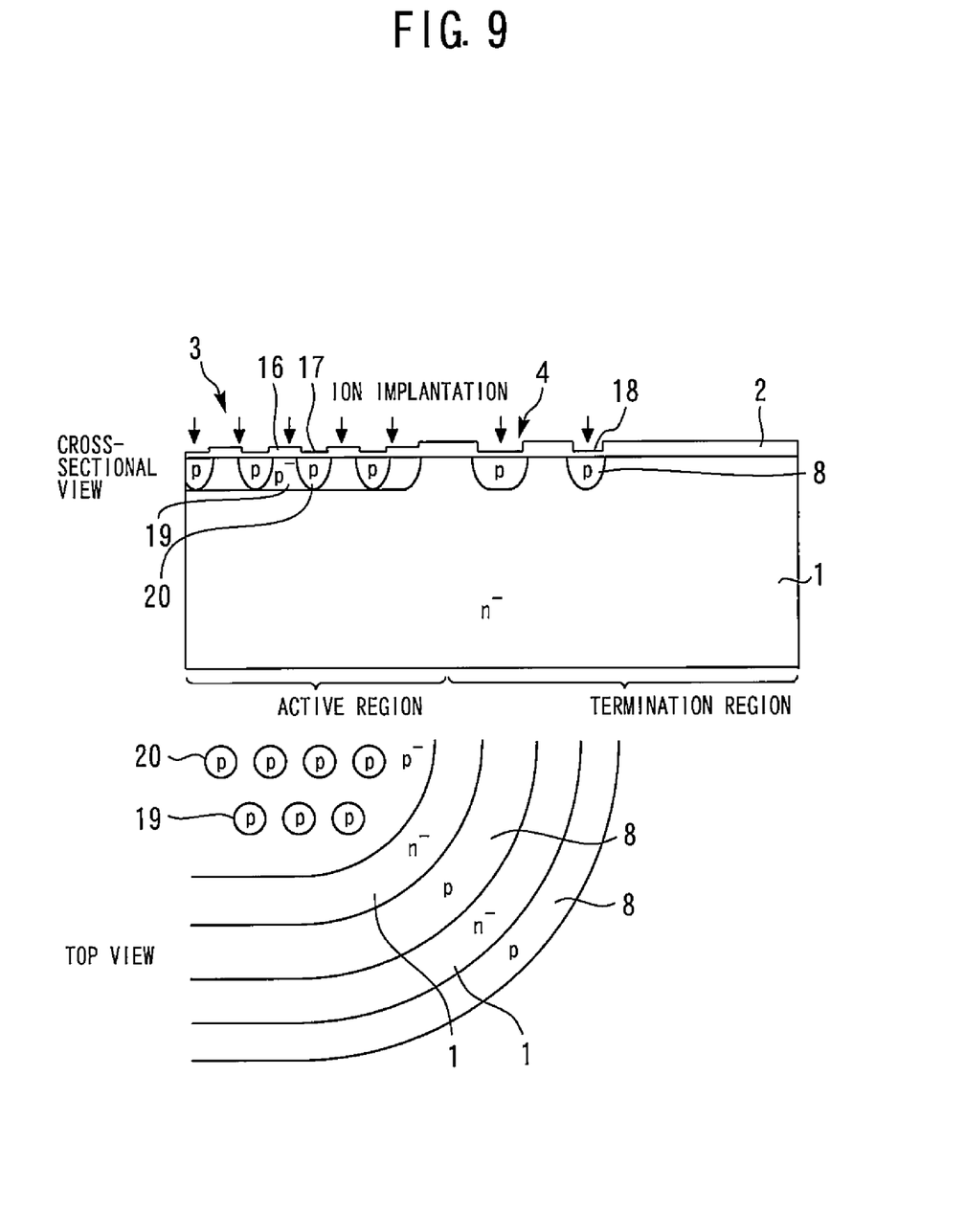
FIG. 9 shows a cross-sectional view and a top view illustrating a method for manufacturing a semiconductor device according to Embodiment 8 of the present invention.

FIG. 9 shows a cross-sectional view and a top view illustrating a method for manufacturing a semiconductor device according to Embodiment 8 of the present invention. In the present embodiment, since the thin film 17 has a dot-like shape, the p-type anode layer 20 also has a dot-like shape. The rest of the configuration is the same as that of Embodiment 7 and effects similar to those of Embodiment 7 can be obtained.

The above-described effects can be obtained regardless of a withstand voltage class. The semiconductor device of the present embodiment is not limited to one formed of silicon, but a semiconductor device formed of a wide band gap semiconductor having a wider band gap than silicon can also provide the above-described effects. Examples of the wide band gap semiconductor include silicon carbide, nitride gallium-based material or diamond. The semiconductor device formed of such a wide band gap semiconductor has a high withstand voltage and a high maximum allowable current density, and can therefore be downsized. Using this downsized semiconductor device also allows a semiconductor module incorporating this semiconductor device to be downsized. Moreover, since the semiconductor device has high heat resistance, it is possible to downsize radiator fins of its heat sink, adopt an air cooling system for its water cooling section and further downsize the semiconductor module. Furthermore, the device has low power loss and high efficiency, and it is thereby possible to provide a more efficient semiconductor module.

DESCRIPTION OF SYMBOLS

1 $n^-$-type semiconductor substrate (semiconductor substrate), 2 oxide film(insulating film), 3 opening(first opening), 4 opening(second opening), 5,16 thin film(first thin film), 6,17 thin film(second thin film), 7 p-type anode layer(diffusion layer), 8 p-type ring layer(ring layer), 15 thin film(third thin film), 19 p-type anode layer(first diffusion layer), 20 p-type anode layer(second diffusion layer)

The invention claimed is:

1. A method for manufacturing a semiconductor device comprising:
    forming an insulating film on a main surface of a semiconductor substrate that includes an active region and a termination region;
    etching the insulating film in the active region to form a first opening;
    using the insulating film as a mask and implanting an impurity into the semiconductor substrate in a direction tilted by 20° or more from a direction normal to the main surface of the semiconductor substrate while rotating the semiconductor substrate to form a diffusion layer in the active region;
    etching the insulating film in the termination region to form a second opening while forming the first opening simultaneously; and
    implanting the impurity into the semiconductor substrate to form the diffusion layer in the active region and a ring layer in the termination region simultaneously,
    wherein the diffusion layer extends wider than the first opening up to below the insulating film on the termination region side.

2. The method for manufacturing the semiconductor device according to claim 1, wherein a first thin film is left in the first opening and a second thin film is left in the second opening when the first and second openings are formed, and
    the impurity is implanted into the semiconductor substrate via the first and second thin films to form the diffusion layer and the ring layer.

3. The method for manufacturing the semiconductor device according to claim 2, wherein the first and second thin films have different film thicknesses.

4. The method for manufacturing the semiconductor device according to claim 2, wherein a third thin film is left at an end of the first opening on the termination region side when the first opening is formed,
    a thickness of the third thin film is smaller than a thickness of the first thin film, and
    the impurity is implanted into the semiconductor substrate via the first and third thin films to form the diffusion layer.

5. The method for manufacturing the semiconductor device according to claim 2, wherein at an end of the first opening on the termination region side, a thickness of the first thin film increases toward the termination region side.

* * * * *